(12) United States Patent
Park et al.

(10) Patent No.: US 7,884,356 B2
(45) Date of Patent: Feb. 8, 2011

(54) METHOD OF PATTERNING NANO CONDUCTIVE FILM

(75) Inventors: Jong-Jin Park, Guri-si (KR);
Myeong-Suk Kim, Suwon-si (KR);
Tae-Yong Noh, Gunpo-si (KR);
Sung-Hun Lee, Seoul (KR); Sang-Yoon Lee, Seoul (KR); Eun-Jeong Jeong, Seongnam-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 980 days.

(21) Appl. No.: 11/394,085

(22) Filed: Mar. 31, 2006

(65) Prior Publication Data

US 2006/0284169 A1 Dec. 21, 2006

(30) Foreign Application Priority Data

Jun. 18, 2005 (KR) .................. 10-2005-0052721

(51) Int. Cl.
*H01L 35/24* (2006.01)
*H01L 51/00* (2006.01)
(52) U.S. Cl. .................. 257/40; 977/788; 552/208
(58) Field of Classification Search .................. 257/40; 977/788; 552/208
See application file for complete search history.

(56) References Cited

U.S. PATENT DOCUMENTS

| 6,441,395 | B1 * | 8/2002 | Yu et al. .................. 257/40 |
| 2001/0000744 | A1 | 5/2001 | Wolk et al. |
| 2004/0180988 | A1 * | 9/2004 | Bernius et al. .................. 523/160 |
| 2004/0251504 | A1 * | 12/2004 | Noda .................. 257/369 |
| 2005/0139867 | A1 * | 6/2005 | Saito et al. .................. 257/213 |
| 2006/0060839 | A1 * | 3/2006 | Chandross et al. .................. 257/40 |
| 2007/0281150 | A1 * | 12/2007 | Yang et al. .................. 428/338 |

OTHER PUBLICATIONS

Carotenuto et al, "A universal method for the synthesis of metal and metal sulfide clusters embedded in polymer matrices," Journal of Materials Chemistry, 2003, 13, 2927-2930.*

Nuzzo, "The future of electronics manufacturing is revealed in the fine print," PNAS, vol. 98, No. 9, Apr. 24, 2001, 4827-4829.*

(Continued)

*Primary Examiner*—Kenneth A Parker
*Assistant Examiner*—Anthony Ho
(74) *Attorney, Agent, or Firm*—Robert E. Bushnell, Esq.

(57) ABSTRACT

A donor substrate for forming a nano conductive film includes a base substrate and a transferring layer that is disposed on the base substrate. The transferring layer includes nano conductive particles and an organic semiconductor. A method of patterning a nano conductive film is provided, wherein a donor substrate in which nano conductive particles are dispersed by employing an organic semiconductor having low molecular weight as a binder is prepared, and nano conductive particles are patterned on a receptor substrate by employing the donor substrate. The method can be used to prepare patterns of various devices including a display device such as an OLED and an OTFT. Such a device can be prepared simply and economically by preparing a device comprising nano conductive particles and an organic semiconductor in wet basis even without deposition.

11 Claims, 2 Drawing Sheets

OTHER PUBLICATIONS

Ouyang et al, "Organic Memory Device Fabricated Through Solution Processing," Proceedings of the IEEE, vol. 93, No. 7, Jul. 2005.*

Transmittal and Chinese Office action issued on Aug. 28, 2009 in corresponding Chinese patent application No. 2006100732819.

* cited by examiner

METHOD OF PATTERNING NANO CONDUCTIVE FILM

CROSS-REFERENCE TO RELATED PATENT APPLICATION AND CLAIM OF PRIORITY

This application claims the benefit of Korean Patent Application No. 10-2005-0052721, filed on Jun. 18, 2005, in the Korean Intellectual Property Office, the disclosure of which is incorporated herein in its entirety by reference.

BACKGROUND OF THE INVENTION

1. Field of the Invention

The present invention relates to a method of patterning a nano conductive film. More particularly, the present invention relates a method of patterning that can be performed under milder conditions than deposition without affecting the thermal stability of the resulting device.

2. Description of the Related Art

Devices with higher integration and precision are required as the semiconductor industry progresses, and thus, micromachining techniques for embodying smaller and more precise micro patterns are required.

Accordingly, there is a need for simple and highly precise patterning of nano conductive particles.

Patterning nano conductive particles using wet process is not performed conventionally. It is almost impossible to disperse nano conductive particles using only wet processing due to properties of nano conductive particles, and thus, in order to disperse nano conductive particles uniformly, a binder such as a polymer was used. That is, generally, a binder polymer is dissolved in a solvent, and nano conductive particles are dispersed therein, and then the mixture is uniformly applied to a surface for patterning. However, such a method results in the deterioration of the conductivity of the nano conductive particles due to the lack of electric conductivity of a polymer.

Further, patterning of indium tin oxide or indium zinc oxide which is widely used in display devices is conventionally achieved by deposition. This method has problems in that it is a high energy-consuming process requiring a high temperature, a required shadow mask is expensive, and deformation occurs due to the expansion of the shadow mask caused by radiant heat, thereby limiting patterning precision.

Furthermore, mobile display devices with paper-like flexibility and high display quality are being developed. In such a flexible display, in order to obtain true flexibility and light weight at low costs, a glass substrate must be substituted with a transparent and flexible plastic substrate. However, a plastic substrate has very low heat-resistance compared to a glass substrate, and can only handle temperatures of about 150° C. to 200° C. Accordingly, deposition on a plastic substrate is limited.

Thus there is a need for a method of patterning a uniform film by dispersing nano conductive particles using a wet process.

SUMMARY OF THE INVENTION

The present invention provides a donor substrate that can be used for precise patterning of conductive particles.

The present invention also provides a method of patterning a nano conductive film comprising an operation of precisely patterning nano conductive particles by employing the donor substrate.

The present invention also provides a nano conductive film.

The present invention also provides a panel display apparatus comprising the nano conductive film.

According to an aspect of the present invention, there is provided a donor substrate for forming a nano conductive film, the donor substrate comprising:
  a base substrate; and
  a transferring layer that is disposed on the base substrate and comprises:
    nano conductive particles; and
    an organic semiconductor.

According to another aspect of the present invention, there is provided a method of patterning a nano conductive film including preparing a donor substrate and; and positioning the donor substrate in a position of close adhesion on a receptor substrate, and irradiating an energy source on the donor substrate, thereby transferring the thermal transfer layer on the receptor substrate to provide a patterned nano conductive film. The donor substrate is prepared by dispersing or dissolving nano conductive particles and an organic semiconductor into a solvent to prepare an organic semiconductor mixture; and applying the organic semiconductor mixture to a base substrate and drying it to form thermal transfer layer.

According to still another aspect of the present invention, there is provided a nano conductive film comprising nano conductive particles and an organic semiconductor.

According to still yet another aspect of the present invention, there is provided a panel display apparatus including a nano conductive film comprising nano conductive particles and an organic semiconductor.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
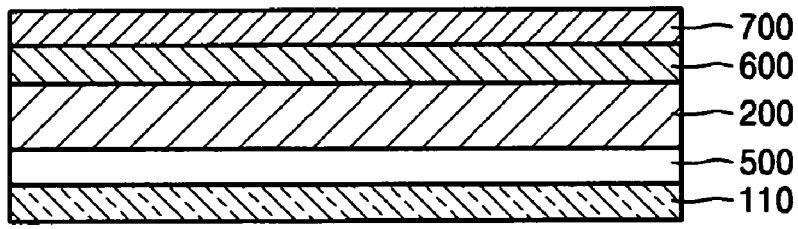
FIGS. 1A through 1F are side-sectional views of donor films according to embodiments of the present invention.
Figure 1B:
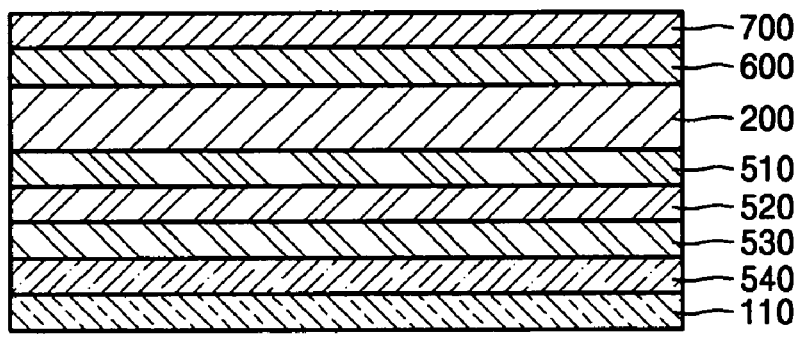
Figure 1C:
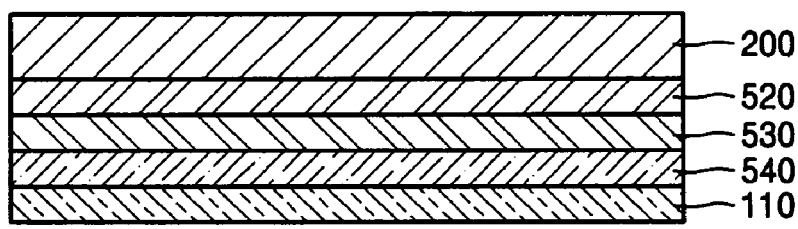
Figure 1D:
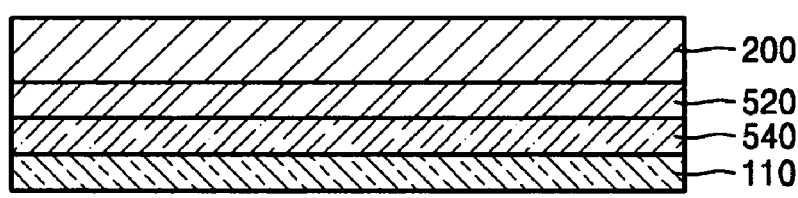
Figure 1E:
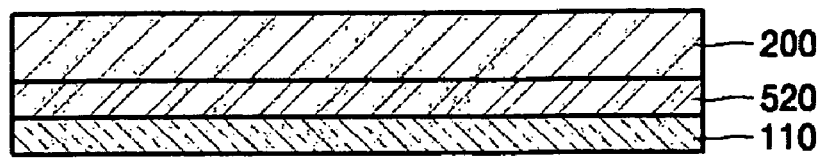
Figure 1F:

The present invention will now be described more fully hereinafter with reference to the accompanying drawings, in which exemplary embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. Like numbers refer to like elements throughout the specification.

According to an aspect of the present invention, there is provided a donor substrate for forming a nano conductive film that can be used in a patterning method.

The donor substrate for forming a nano conductive film of the present invention comprises a base substrate; and nano conductive particles and an organic semiconductor on the base substrate.

The nano conductive particles may be, but are not limited to, metal oxide particles, metal particles, semiconductor particles or mixtures thereof. The average particle diameter of the nano conductive particles may be 2 to 20 nm. If the average particle diameter of the nano conductive particles is less than 2 nm, the particles are prone to aggregation, and are thus not easily dispersed. If the average diameter exceeds 20 nm, the melting point of a nano metal is increased.

Although the nano conductive particles in themselves cannot be wet coated since the nano conductive particles are particles, the nano conductive particles can be wet coated to form a film when dispersed in a solution that is prepared by dissolving the organic semiconductor in a solvent. Conventionally, the nano conductive particles are dispersed in a polymer, but the conductivity of the resultant film is low since the conductivity of the polymer is low.

The metal oxide particles may be indium tin oxide (ITO), indium zinc oxide (IZO), indium oxide, tin oxide, zinc oxide, titanium oxide, cesium oxide, antimony oxide, cadmium oxide or a mixture thereof. These metal oxides are transparent and have excellent electric conductivity, and thus are widely used as electrodes of display devices, etc.

The metal particles may be gold (Au), silver (Ag), copper (Cu), palladium (Pd) or platinum (Pt) particles, or a mixture thereof. The metal particles can be used as catalysts for a chemical reaction, or as a conducting material.

Particularly, the metal particles can be those in which a metal atom on the surface of the particles is substituted with a substituent, as represented by formula I below:

I wherein M represents a metal particle such as Au, Ag, Cu, Pd or Pt; X represents S or CN; Y represents a multivalent organic substituent having 2 to 50 carbons, which may be preferably an alkylene group having 2 to 50 carbons, benzene, diphenyl, or a hydrocarbon group having 2 to 50 carbons including —CONH—, —COO—, —Si—, bis-(porphyrin) and/or —CO— within it; and n represents an integer of 1 to 20. An example of the metal particles represented by formula I is represented by formula II below:

II.

The semiconductor particles are nano crystals comprising a Group II atom and a Group VI atom; a Group III atom and a Group V atom; or by Group VI atoms, and are different than the organic semiconductor.

Specific examples of the semiconductor particles include, but are not limited to, CdS, CdSe, CdTe, ZnS, ZnSe, ZnTe, HgS, HgSe, HgTe, GaN, GaP, GaAs, InP, InAs and mixtures thereof.

The organic semiconductor can be dissolved in a solvent, and may be, but is not limited to, a pentacene derivative; a tetracene derivative; an anthracene derivative; a naphthalene derivative; an oligothiophene such as α-4-thiophene, α-5-thiophene and α-6-thiophene, or its derivative; thienophene or its derivative; sexithiophene or its derivative; oligophenylene or its derivative; thiophenylene vinylene or its derivative; perylene or its derivative; dioxborine or its derivative; rubrene or its derivative; coronene or its derivative; perylene tetracarboxylic diimide or its derivative; perylene tetracarboxylic dianhydride or its derivative; oligoacene of naphthalene or its derivative; phthalocyanine optionally containing metal, or its derivative; quinodimethane or its derivative; pyromellitic dianhydride or its derivative; or pyromellitic diimide or its derivative. The organic semiconductor having low molecular weight can be used as a binder so that the deterioration of the conductivity of the nano conductive particles due to the lack of electric conductivity of a polymer binder may be prevented.

Further, the organic semiconductor used in the present embodiment can be a material having a substituent incorporated into side chains of which a pyrolysis occurs at 150° C. to 250° C., as represented by formulae III through VII below:

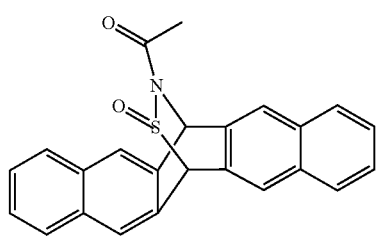

III

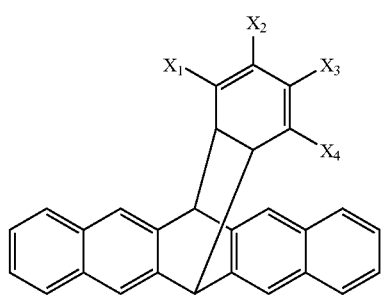

IV

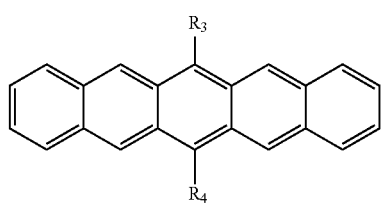

V

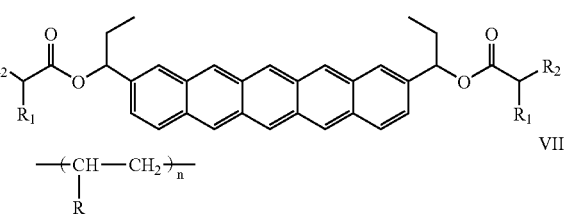

VI

VII wherein $R_1$ and $R_2$ are each independently an alkyl group having 1 to 40 carbons, a cycloalkyl group having 4 to 40 carbons, an alkoxy group having 1 to 40 carbons, an aryl group having 6 to 40 carbons, an aryloxy group having 6 to 40 carbons, an alkenyl group having 2 to 40 carbons, an alkylaryl group having 7 to 40 carbons, an arylalkyl group having 7 to 40 carbons, an arylalkenyl group having 8 to 40 carbons, or an alkynyl group having 2 to 40 carbons; $R_3$ and $R_4$ are each independently an alkyl group having 4 to 40 carbons, a silyl group having 3 to 40 carbons, or a siloxyl group having 3 to 40 carbons; R is a compound selected from the compounds represented by the formulae III through VI; $X_1$, $X_2$, $X_3$ and $X_4$ are each independently hydrogen or a halogen atom, but are not all hydrogen atoms. Particularly, $R_3$ and $R_4$ may be butyl, pentyl, hexyl, heptyl, octyl, trimethylsilyl, triethylsilyl or triisopropylsilyl.

The donor substrate can further comprise various layers such as a light-heat converting layer, an anchoring layer, a primer layer, a heat-resistant lubricant layer, an intermediate layer, a mold release layer and a subbing layer. Embodiments of the donor substrate further comprising the various layers are described below with reference to FIG. 1.

Referring to FIG. 1A, the donor substrate can comprise an anchoring layer 500 between a base substrate 200 and an organic semiconductor precursor layer 110. The anchoring layer 500 plays a role in attaching the base substrate 200 to the organic semiconductor precursor layer 110. The material composing the anchoring layer 500 and the method of forming the anchoring layer 500 can be those well known in the art, and are not particularly limited.

A heat-resistant lubricant layer 700 can be formed on the base substrate 200. The heat-resistant lubricant layer 700 prevents other film layer from melting due to applied heat and contaminating a thermal source, and the material composing the heat-resistant lubricant layer 700 and the method of forming the heat-resistant lubricant layer 700 can be those well known in the art, and are not particularly limited.

The donor substrate can further comprise a subbing layer 600 to relax heat impact and reduce physical scratches between the base substrate 200 and the heat-resistant lubricant layer 700. The material composing the subbing layer 600 and the method of forming the subbing layer 600 can be those well known in the art, and are not particularly limited.

FIGS. 1B through 1F illustrate other embodiments of the donor substrate.

A light-heat converting layer 520 converts light received from the outside into heat, and only the irradiated part of the light-heat converting layer 520 is transferred. A primer layer 510 enhances adhesion between the base substrate 200 and the light-heat converting layer 520. An intermediate layer 530 prevents the transferred part of the organic semiconductor precursor layer 110 from being damaged or contaminated, and the mold release layer 540 facilitates transferring of the transferred part of the organic semiconductor precursor layer 110 so that the transferred part is well released due to heat.

The primer layer 510, the light-heat converting layer 520, the intermediate layer 530 and the mold release layer 540 are well known to the art, and are not particularly limited.

According to another aspect of the present invention, there is provided a method of patterning a nano conductive film comprising (a) dispersing or dissolving nano conductive particles and an organic semiconductor into a solvent to prepare an organic semiconductor mixture; (b) coating a base substrate with the organic semiconductor mixture and drying the organic semiconductor mixture to form thermal transfer layer, thereby providing a donor substrate; and (c) closely adhering the donor substrate on a receptor substrate and radiating an energy source onto the donor substrate to transfer the thermal transfer layer onto the receptor substrate and provide a patterned nano conductive film.

In the method of the present embodiment, first, the nano conductive particles are dispersed in a solvent and the organic semiconductor is dissolved in the solvent to form an organic semiconductor mixture.

The organic semiconductor mixture may include 10 to 60% by weight of the organic semiconductor, 5 to 50% by weight of the nano conductive particles, and 5 to 60% by weight of the solvent, based on the total weight of the organic semiconductor mixture.

If the amount of the organic semiconductor is less than 10% by weight, it is difficult to form a uniform film, and if the amount of the organic semiconductor exceeds 60% by weight, the effect of the nano conductive particles is decreased. If the amount of the nano conductive particles is less than 5% by weight, connections between particles for conductivity become non-uniform, and if the amount of the nano conductive particles exceeds 50% by weight, it becomes difficult to disperse the nano conductive particles. If the amount of the solvent is less than 5% by weight, uniform dispersion becomes difficult, and if the amount of the solvent exceeds 60% by weight, it is economically disadvantageous since a long time is required for drying. However, the amount of the solvent may be such that a viscosity of the semiconductor mixture is suitable for preparing a coating film.

The nano conductive particles may be metal oxide particles, metal particles, semiconductor particles or mixtures thereof. The metal oxide particles, metal particles and semiconductor particles are the same as described above.

A solvent dispersing the nano conductive particles and the organic semiconductor may be a single-component solvent or a multi-component solvent, and may be, but is not limited to, a halogen, an alcohol, a ketone, an ester, an aliphatic hydrocarbon, an aromatic hydrocarbon, an ether based solvent, or a mixture thereof. Specific and non-limiting examples of the solvent include water, acetone, methanol, ethanol, isopropyl alcohol, n-propyl alcohol, butyl alcohol, dimethyl acetamide (DMAc), dimethyl imidazoline (DMI), dimethyl formamide, tetrachloroethane, dimethyl sulfoxide (DMSO), N-methyl-2-pyrollidone (NMP), tetrahydrofuran (THF), tetrabutyl acetate, n-butyl acetate, m-cresol, toluene, xylene, ethyleneglycol (EG), ɤ-butyrolactone, or hexafluoroisopropanol (HFIP). These solvents can be used alone or in combination.

The organic semiconductor mixture may further comprise a surfactant and/or a dispersion enhancer.

The surfactant may be, but is not limited to, a nonionic surfactant such as sorbitan monooleate, POE sorbitan monooleate, N,N'-dimethyl formamide dicyclohexyl acetal, polyoxyethylene alkyl amine, glycerol, and fatty acid ester; a cationic surfactant such as amine salt and quaternary ammonium salt; an anionic surfactant such as dialkyl sulfosuccinate, alkyl-alphasulfocarbonate, petroleum sulfonate, alkyl-naphthalene sulfonate, phosphoric esterate and alkyl phosphate; or an amphiphatic surfactant such as N-lauryl-β-acetic acid), N-lauryl-β-aminopropionic acid, N-lauryl-β-aminobutyric acid, aminocarboxylic acid and betanate.

The dispersion enhancer may be, but is not limited to, at least one of a saturated fatty acid such as palmitic acid or stearic acid having 16 to 20 carbons or a metal salt thereof containing sodium, potassium, calcium, zinc or copper; or an unsaturated fatty acid such as oleic acid or linolenic acid having 16 to 20 carbons or a metal salt thereof containing sodium, potassium, calcium, zinc or copper.

In addition, the organic semiconductor may further comprise a thickener or an antistatic agent.

The organic semiconductor mixture prepared as described above is uniformly applied to a base substrate to form a transfer layer.

The base substrate may be a film from which the nano conductive particles and the organic semiconductor mixture can be thermally transferred onto a receptor substrate, and is not particularly limited. Specific examples of the material composing the base film include polyester, polyether sulfone, polystyrene, polyethylene, polypropylene, polyamide, polyimide, a cellulosic resin, polyurethane, a fluorine-based resin such as polytetrafluoroethylene, a vinyl compound such as polyvinyl chloride, polyacrylic acid, polyacrylic acid ester, polyacrylonitrile, an addition polymer of a vinyl compound, polymethacrylic acid, polymethacrylic acid ester, a vinylidene compound such as polyvinylidene chloride, fluorinated vinylidene/trifluoroethylene copolymer, a vinyl compound such as ethylene/acetic acid vinyl copolymer, a copolymer of a fluorine-based compound, a polyether such as polyethylene oxide, an epoxy resin, polyvinyl alcohol, other transparent elastomer of polyvinylbutyral such as silicon rubber, urethane rubber, acrylic rubber, styrene-butadiene rubber, soft polyvinyl chloride, an elastomer of an ethylenic copolymer such as ethylene-propylene copolymer, ethylene-butene copolymer, ethylene-acetic acid vinyl copolymer, an ethylenic transparent composition such as crosslinking agent of an ethylenic copolymer and an ethylene-propylene-diene copolymer mixture, an thermoplastic elastomer such as styrenic thermoplastic elastomer, urethane-based thermoplastic elastomer. Preferably, the base film may be polyethyleneterephthalate, polyvinyl chloride, polystyrene, polypropylene, polyester, polytetrafluoroethylene or polyacrylic acid, and more preferably, polyethyleneterephthalate or polyethylenenaphthalate.

A method of applying the organic semiconductor mixture uniformly onto the base substrate may be any method well known to the art, and is not particularly limited. Specific examples of the applying method include spin coating, spray coating, roll coating, dip coating, and knife coating.

The thickness of the applied organic semiconductor mixture may be about 30 to 50 μm, but is not particularly limited. If the total thickness of the coated organic semiconductor mixture exceeds 50 μm, the transferred part becomes too thick to transfer thermal energy, and the organic semiconductor mixture is not thermally transferred cleanly.

Any remaining solvent is removed by drying so that a donor substrate is prepared. The drying conditions are not particularly limited, and may be room temperature or 50 to 100° C. in air or under nitrogen atmosphere. Quicker drying can be carried out under reduced pressure with forced air convection.

The donor substrate can further comprise various layers such as a light-heat converting layer, an anchoring layer, a primer layer, a heat-resistant lubricant layer, an intermediate layer, a mold release layer and a subbing layer. The role of these layers, the material composing them and the method of forming them are as explained above.

Accordingly, the method of patterning can further comprise, before applying the organic semiconductor mixture on the base substrate, at least one of forming a light-heat converting layer on the base substrate; forming an anchoring layer; forming a primer layer; forming a heat-resistant lubricant layer; forming an intermediate layer; forming a mold release layer; and forming a subbing layer.

In order to transfer the mixture of the nano conductive particles and the organic semiconductor of the donor substrate onto a receptor substrate, the donor substrate dried as above is adhered to the receptor substrate, and then energy is applied thereto according to a desired pattern. The energy can be applied by applying heat directly, or applying energy induced by light, pressure or electricity, though the method used is not particularly limited.

When heat is applied for transferring, heat can be applied to a selected part at a range of 90 to 230° C.

When light is employed for transferring, light can be radiated by scanning of an IR laser, and the irradiation time can be controlled according to light intensity.

When light is employed, the donor substrate may include a light-heat converting layer. The light-heat converting layer may be formed between the base substrate and the organic semiconductor layer. The light-heat converting layer can be made of a light-absorbing material absorbing light in an infrared-visible light range. Films having such a property include metal films made of aluminum and the oxide and sulfide; and organic films made of polymers to which carbon black, graphite or an infrared dye is added. The metal film can be coated to a thickness of 100 to 5000 Å by employing vacuum deposition, electron beam deposition or sputtering.

When the light-heat converting layer is further included as described above, an intermediate layer can be further included between the light-heat converting layer and the organic semiconductor layer so that the light-heat converting layer and the organic semiconductor layer can be well separated. The intermediate layer can be made of a thermosetting polymer or a thermoplastic polymer, crosslinkable polyacrylate, polymethacrylate, polyester, epoxide or polyurethane.

When pressure is employed for transferring, pressure is applied according to the desired pattern, and the pressure may be of 100 mPa to 10 kPa.

When a current electricity is employed for transferring, the current density may be 1 mA/cm$^2$ to 10 A/cm$^2$.

A heating operation can be further performed after transferring. The heating operation can be carried out using conventional method, and is not particularly limited, but may be carried out at temperature of 90 to 230° C.

Any material known in the art can be employed as the receptor material, and is not particularly limited. The material may have good surface uniformity, high mechanical strength, and excellent light transmission for use in a display. For example, the material may be silicon, glass or transparent plastic.

The layer including the nano particles and the organic semiconductor which are transferred on the receptor substrate can be an electron injecting layer, an electron transporting layer, a light-emitting layer, a hole transporting layer or a hole injecting layer for an organic electroluminescent display device, or can be a channel layer or an electrode layer for an organic TFT.

According to another aspect of the present invention, there is provided a nano conductive film comprising nano conductive particles and an organic semiconductor. The nano conductive film can be prepared by employing the method of patterning the nano conductive film.

According to another aspect of the present invention, there is provided a panel display apparatus including a nano conductive film comprising nano conductive particles and an organic semiconductor. The panel display apparatus includes a display device such as an organic light-emitting display device. The nano conductive film can be prepared by the method of patterning the nano conductive film and the panel display apparatus can be prepared by a method known in the art by employing the nano conductive film.

The present invention will now be described in greater detail with reference to the following examples. The following examples are for illustrative purposes only and are not intended to limit the scope of the invention.

Example 1

Preparation of Nano Conductive Organic Semiconductor Mixture 1 g of a nano powder of indium tin oxide (average particle diameter of 10 to 12 nm) and 4 g of chloroform as a dispersion enhancer were mixed by stirring for 30 minutes, and then 1 g of pentacene represented by formula III substituted with N-sulfone group and 4 g of toluene as a solvent were added thereto. Then the mixture was well stirred for 60 minutes to prepare a uniform nano conductive organic semiconductor mixture.

Example 2

Preparation of Nano Conductive Organic Semiconductor Donor Substrate 4-chlorophenol was uniformly applied as an anchoring layer on a PET base film by spin-coating, and then result was dried for 1 hour at room temperature. A film was prepared by uniformly applying the nano conductive organic semiconductor mixture prepared in Example 1 on the dried anchoring layer by employing spin-coating. The prepared coating film was dried for 1 hour at 100° C. in a drying box.

The dried donor film was closely adhered to a glass substrate, and then a pattern was transferred to the glass substrate by thermal transferring at 150° C. The transferred glass substrate was heated for 10 minutes at 210° C. so that a pyrolysis of a compound of the formula I occurred, thereby forming a patterned film including the organic semiconductor.

Example 3

Preparation of Flexible Display

The donor substrate prepared in Example 2 was closely adhered to a PET substrate, and then a nano conductive film in which pentacene substituted with N-sulfone group and a nano powder of indium tin oxide were mixed was selectively transferred with a desired pattern to a PET substrate by thermal transferring using a thermal transfer printer (Model SVM-75LS) available from Sony Corporation. PEDOT/PSS was coated on the nano conductive film as a hole transporting layer with a thickness of 50 nm, and then dried for 30 minutes at 100° C. Then, a light-emitting layer composed of a spirofluorene-based light-emitting polymer, which is a blue light-emitting material, was formed on the hole transporting layer to a thickness of 100 nm, LiF was deposited on the light-emitting layer to a thickness of 3 nm, and Al was coated as a second electrode on the electron injecting layer to a thickness of 200 nm to prepare a flexible organic light-emitting display device.

Figure 2:
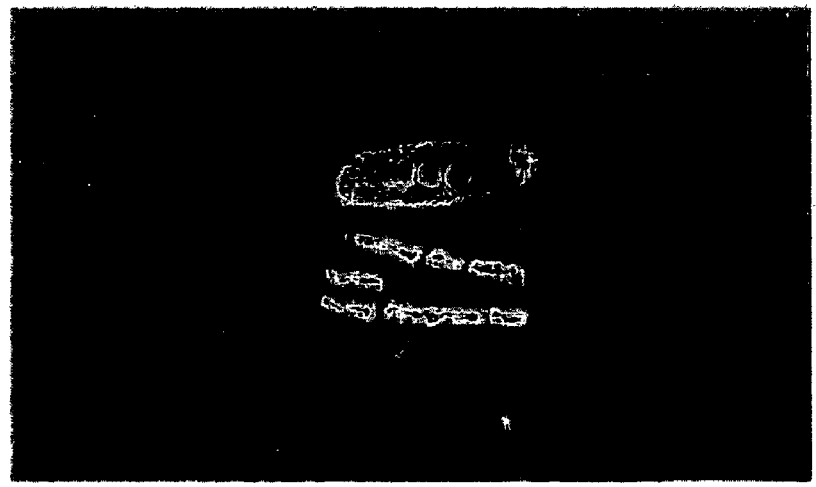
FIG. 2 is a photograph showing an illuminated display device prepared according to an embodiment of the present invention.

As a result, a flexible display that emits light according to a desired pattern as shown in FIG. 2 was prepared.

The present invention relates to a method of patterning a nano conductive film that can be used to prepare various devices including a display device such as an OLED and an OTFT. According to the present invention, the device can be prepared simply and economically by preparing a device comprising nano conductive particles and an organic semiconductor in wet basis, even without deposition.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A donor substrate for forming a nano conductive film, the donor substrate comprising:
   a base substrate; and
   a transferring layer disposed on the base substrate, the transferring layer comprising:
   nano conductive particles; and
   an organic semiconductor in which the nano conductive particles are dispersed,
   wherein the organic semiconductor is at least one compound selected from the group consisting of compounds represented by Formulae III through VII:

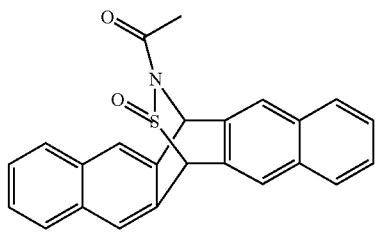

III

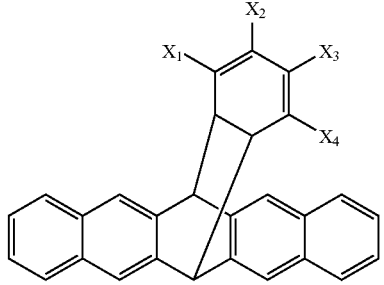

IV

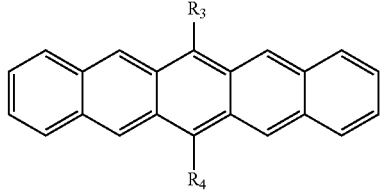

V

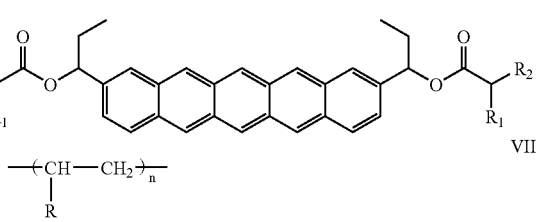

VI

VII wherein $R_1$ and $R_2$ are each independently an alkyl group having 1 to 40 carbons, a cycloalkyl group having 4 to 40 carbons, an alkoxy group having 1 to 40 carbons, an aryl group having 6 to 40 carbons, an aryloxy group having 6 to 40 carbons, an alkenyl group having 2 to 40 carbons, an alkylaryl group having 7 to 40 carbons, an arylalkyl group having 7 to 40 carbons, an arylalkenyl group having 8 to 40 carbons, or an alkynyl group having 2 to 40 carbons;

$R_3$ and $R_4$ are each independently an alkyl group having 4 to 40 carbons, a silyl group having 3 to 40 carbons, or a siloxyl group having 3 to 40 carbons;

R is a compound selected from the group consisting of pentacene of which N-sulfonyl group is substituted, and compounds represented by formulae IV through VI; and $X_1, X_2, X_3$ and $X_4$ are each independently hydrogen or a halogen atom, but are not all hydrogen atoms.

2. The donor substrate according to claim 1, wherein the nano conductive particles are metal oxide particles, metal particles, semiconductor particles or a mixture thereof.

3. The donor substrate according to claim 2, wherein the nano conductive particles are the metal oxide particles of indium tin oxide (ITO), indium zinc oxide (IZO), indium oxide, tin oxide, zinc oxide, titanium oxide, cesium oxide, antimony oxide or cadmium oxide, or a mixture thereof.

4. The donor substrate according to claim 2, wherein the nano conductive particles are the metal particles of gold, silver, copper, palladium or platinum particles, or a mixture thereof.

5. The donor substrate according to claim 4, wherein the metal particles are represented by Formula I:

$$M\text{-}(X\text{---}Y)_n \qquad \text{I}$$

wherein M is Au, Ag, Cu, Pd or Pt;
X is S or CN;
Y is a multivalent organic substituent having 2 to 50 carbons selected from the group consisting of an alkylene group having 2 to 50 carbons, benzene, diphenyl, and a hydrocarbon group having 2 to 50 carbons and including —CONH—, —COO—, —Si—, bis-(porphyrin) or —CO—; and
n is an integer of 1 to 20.

6. The donor substrate according to claim 5, wherein the metal particles are represented by Formula II:

$$M\text{-}(S\text{---}(CH_2)_6OH)_n \qquad \text{II.}$$

wherein n is an integer of 1 to 20.

7. The donor substrate according to claim 2, wherein the nano conductive particles are the semiconductor particles of nano crystals having (i) Group II atoms and Group VI atoms, (ii) Group III atoms and Group V atoms, or (iii) Group VI atoms.

8. The donor substrate according to claim 7, wherein the semiconductor particles include at least one of CdS, CdSe, CdTe, ZnS, ZnSe, ZnTe, HgS, HgSe, HgTe, GaN, GaP, GaAs, InP, InAs and a mixture thereof.

9. The donor substrate according to claim 1, wherein the average particle diameter of the nano conductive particles is 2 nm to 20 nm.

10. The donor substrate according to claim 1, further comprising at least one layer selected from the group consisting of a light-heat converting layer, an anchoring layer, a primer layer, a heat-resistant lubricant layer, an intermediate layer, a mold release layer and a subbing layer.

11. A donor substrate for forming a nano conductive film, the donor substrate comprising:
a base substrate; and
a transferring layer disposed on the base substrate, the transferring layer comprising:
nano conductive particles; and
an organic semiconductor in which the nano conductive particles are dispersed,
wherein the metal particles are represented by Formula:

$$M\text{-}(S(CH_2)_6OH)_n, \text{ and}$$

wherein M is Au, Ag, Cu, Pd or Pt and n is an integer of 1 to 20.

* * * * *